(12) United States Patent
Kishimoto (10) Patent No.: US 11,309,862 B2
(45) Date of Patent: Apr. 19, 2022

(54) ACOUSTIC WAVE DEVICE, HIGH FREQUENCY FRONT END CIRCUIT, AND COMMUNICATION APPARATUS

(71) Applicant: Murata Manufacturing Co., Ltd., Nagaokakyo (JP)

(72) Inventor: Yutaka Kishimoto, Nagaokakyo (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 363 days.

(21) Appl. No.: 16/718,295

(22) Filed: Dec. 18, 2019

(65) Prior Publication Data

US 2020/0127636 A1    Apr. 23, 2020

Related U.S. Application Data

(63) Continuation of application No. PCT/JP2018/022872, filed on Jun. 15, 2018.

(30) Foreign Application Priority Data

Jun. 23, 2017 (JP) .............................. JP2017-123608

(51) Int. Cl.
*H03H 9/02* (2006.01)
*H03F 3/189* (2006.01)
(Continued)

(52) U.S. Cl.
CPC ......... *H03H 9/02952* (2013.01); *H03F 3/189* (2013.01); *H03H 3/10* (2013.01);
(Continued)

(58) Field of Classification Search
CPC .. H03H 9/02952; H03H 3/10; H03H 9/02834; H03H 9/02866; H03H 9/02992;
(Continued)

(56) References Cited

U.S. PATENT DOCUMENTS

2008/0211602 A1    9/2008 Khelif et al.
2013/0234805 A1*   9/2013 Takahashi ............... H01L 41/29
                                                        29/25.35
(Continued)

FOREIGN PATENT DOCUMENTS

JP    2008-530874 A    8/2008
WO    2012/086441 A1   6/2012
(Continued)

*Primary Examiner* — Hafizur Rahman
(74) *Attorney, Agent, or Firm* — Keating & Bennett, LLP (57) ABSTRACT

An acoustic wave device includes in order a substrate, an acoustic reflection layer, a piezoelectric layer, an IDT electrode including a pair of comb electrodes, and wiring electrodes. The acoustic reflection layer includes a low Z dielectric layer, a high Z dielectric layer below the low Z dielectric layer and having an acoustic impedance higher than that of the low Z dielectric layer, and a metal layer above the low Z dielectric layer and having an acoustic impedance higher than that of the low Z dielectric layer. When the acoustic reflection layer is viewed in plan, in a region encompassing the IDT electrode and the wiring electrodes but no IDT electrodes other than the IDT electrode, an area including the metal layer is smaller than an area including the high Z dielectric layer.

20 Claims, 6 Drawing Sheets

(51) Int. Cl.
  *H03H 3/10* (2006.01)
  *H03H 9/05* (2006.01)
  *H03H 9/145* (2006.01)
  *H03H 9/25* (2006.01)
  *H03H 9/64* (2006.01)
  *H03F 3/20* (2006.01)

(52) U.S. Cl.
  CPC .... *H03H 9/02834* (2013.01); *H03H 9/02866* (2013.01); *H03H 9/02992* (2013.01); *H03H 9/0561* (2013.01); *H03H 9/145* (2013.01); *H03H 9/25* (2013.01); *H03H 9/6483* (2013.01); *H03F 3/20* (2013.01); *H03F 2200/165* (2013.01); *H03F 2200/171* (2013.01); *H03F 2200/294* (2013.01); *H03F 2200/451* (2013.01)

(58) Field of Classification Search
  CPC ........ H03H 9/0561; H03H 9/145; H03H 9/25; H03H 9/6483; H03F 3/189; H03F 3/20; H03F 2200/165; H03F 2200/171; H03F 2200/294; H03F 2200/451
  USPC .......................................................... 330/185
  See application file for complete search history.

(56) References Cited

U.S. PATENT DOCUMENTS

| 2013/0271238 A1* | 10/2013 | Onda ................ H03H 9/725 333/195 |
| 2014/0152146 A1* | 6/2014 | Kimura ............ H03H 9/02228 29/25.35 |
| 2014/0225684 A1* | 8/2014 | Kando ................ H03H 9/64 333/195 |
| 2017/0366160 A1 | 12/2017 | Kishimoto et al. |
| 2017/0366163 A1 | 12/2017 | Kishimoto |

FOREIGN PATENT DOCUMENTS

| WO | 2016/147688 A1 | 9/2016 |
| WO | 2016/147986 A1 | 9/2016 |

\* cited by examiner

FIG. 1A

ACOUSTIC WAVE (MAIN MODE) PROPAGATION DIRECTION

ACOUSTIC WAVE DEVICE, HIGH FREQUENCY FRONT END CIRCUIT, AND COMMUNICATION APPARATUS

CROSS REFERENCE TO RELATED APPLICATIONS

This application claims the benefit of priority to Japanese Patent Application No. 2017-123608 filed on Jun. 23, 2017 and is a Continuation Application of PCT Application No. PCT/JP2018/022872 filed on Jun. 15, 2018. The entire contents of each application are hereby incorporated herein by reference.

BACKGROUND OF THE INVENTION

1. Field of the Invention

The present invention relates to an acoustic wave device that includes an IDT (InterDigital Transducer) electrode, a high frequency front end circuit, and a communication apparatus.

2. Description of the Related Art

Acoustic wave devices that include an acoustic wave resonator have been widely used as band pass filters for mobile communication equipment.

In Japanese Unexamined Patent Application Publication No. 2008-530874, an acoustic wave device in which a substrate, an acoustic reflector, a piezoelectric film, an IDT electrode, and a busbar electrode are laminated in this order is disclosed. The acoustic reflector has a structure in which films having different acoustic impedances are alternately laminated. With this structure, acoustic waves used as high frequency propagation means can be confined in an upper portion of the acoustic reflector. Thus, a low-loss and compact acoustic wave device can be designed for a frequency of 3 GHz or more.

However, in the case of the acoustic wave device that includes an acoustic reflector disclosed in Japanese Unexamined Patent Application Publication No. 2008-530874, when a metal film is used as a film forming the acoustic reflector, an unintentional capacitive component is generated between the metal film, which forms the acoustic reflector, and the IDT electrode, the busbar electrode, and a wiring electrode that are formed on the piezoelectric film. There is a problem of such a capacitive component degrading high frequency propagation characteristics of acoustic waves.

SUMMARY OF THE INVENTION

Preferred embodiments of the present invention provide acoustic wave devices, high frequency front end circuits, and communication apparatuses in each of which an unwanted capacitive component by an acoustic reflection layer is reduced or prevented and acoustic wave propagation loss is reduced or prevented.

An acoustic wave device according to a preferred embodiment of the present invention includes a supporting substrate; an acoustic reflection layer that is laminated directly or indirectly on the supporting substrate; a piezoelectric layer that is laminated directly or indirectly on the acoustic reflection layer; one or more IDT electrodes that are provided directly or indirectly on the piezoelectric layer; and a wiring electrode that is provided directly or indirectly on the piezoelectric layer and electrically connected to the one or more IDT electrodes. The acoustic reflection layer includes a first dielectric layer, a second dielectric layer that is closer to the supporting substrate than the first dielectric is to the supporting substrate and has an acoustic impedance higher than that of the first dielectric layer, and a metal layer that is closer to the piezoelectric layer than the first dielectric layer is to the piezoelectric layer and has an acoustic impedance higher than that of the first dielectric layer. When the acoustic reflection layer is viewed in plan, in a region that encompasses one of the one or more IDT electrodes and a wiring electrode connected to the one IDT electrode but does not encompass any IDT electrodes other than the one IDT electrode, an area in which the metal layer is provided is smaller than an area in which the second dielectric layer is provided.

Accordingly, when viewed in plan as described above, the metal layer that has an acoustic impedance higher than that of the first dielectric layer encompasses the IDT electrode with the piezoelectric layer interposed therebetween. Therefore, a suitable capacitive component can be added to an acoustic wave resonator defined by the IDT electrode and the piezoelectric layer, and a main mode of acoustic waves can be confined above the metal layer. Furthermore, when viewed in plan as described above, the metal layer does not encompass only the wiring electrode. Therefore, an unwanted capacitive component generated by the wiring electrode and the metal layer is able to be reduced or prevented. In contrast, regarding downward leakage of the main mode of acoustic waves in a region in which the metal layer is not provided, upward reflection occurs on a surface of the second dielectric layer having an area larger than that of the metal layer and that has an acoustic impedance higher than that of the first dielectric layer. Therefore, propagation loss of the acoustic waves is able to be reduced or prevented. That is, the main mode of acoustic waves are able to be confined above the metal layer, and an unwanted capacitive component is able to be reduced or prevented, such that acoustic wave propagation loss is reduced or prevented.

Furthermore, each of the one or more IDT electrodes may include a pair of comb-shaped electrodes. A film thickness of the piezoelectric layer may be less than or equal to an IDT wavelength, which is defined by a pitch of a plurality of electrode fingers defining one of the pair of comb-shaped electrodes.

Accordingly, use efficiency of acoustic waves is able to be improved or optimized, and acoustic wave propagation characteristics are thus able to be improved.

Furthermore, the acoustic reflection layer may further include a third dielectric layer between the metal layer and the piezoelectric layer and having an acoustic impedance lower than that of the metal layer.

Accordingly, the main mode of acoustic waves is able to be reflected upwards on the interface between the third dielectric layer and the metal layer.

Furthermore, a film thickness of the third dielectric layer and a film thickness of the first dielectric layer may be different.

Accordingly, the film thickness composition ratio of the third dielectric layer and the metal layer optimal to reflect the main mode of acoustic waves on the interface between the third dielectric layer and the metal layer and the film thickness composition ratio of the first dielectric layer and the second dielectric layer optimal to reflect the main mode of acoustic waves on the interface between the first dielectric layer and the second dielectric layer are able to be separately adjusted. That is, confinement efficiency of the main mode of acoustic waves is able to be further improved, and the film thickness symmetry of the acoustic reflection layer is able to be destroyed, such that unwanted waves are further reduced or prevented.

Furthermore, the acoustic reflection layer may include at least one of a plurality of metal layers laminated in a perpendicular or substantially perpendicular direction of the piezoelectric layer and a plurality of second dielectric layers laminated in the perpendicular or substantially perpendicular direction. A fourth dielectric layer that has an acoustic impedance lower than that of the metal layer may be provided between the plurality of metal layers. A fifth dielectric layer that has an acoustic impedance lower than that of the second dielectric layer may be provided between the plurality of second dielectric layers.

Accordingly, in the acoustic reflection layer, the metal layer and the second dielectric layer, which are high acoustic impedance layers, and the fourth dielectric layer, the first dielectric layer, and the fifth dielectric layer, which are low acoustic impedance layers, are alternately laminated. Therefore, the main mode of acoustic waves propagated downwards from the above can be reflected in a hierarchical manner on an upper surface of each of the high acoustic impedance layers. Thus, propagation loss of acoustic waves is able to be reduced more effectively.

Furthermore, a film thickness of the fourth dielectric layer and a film thickness of the fifth dielectric layer may be different.

Accordingly, the film thickness composition ratio of the fourth dielectric layer and the metal layer optimal to reflect the main mode of acoustic waves on the interface between the fourth dielectric layer and the metal layer and the film thickness composition ratio of the fifth dielectric layer and the second dielectric layer optimal to reflect the main mode of acoustic waves on the interface between the fifth dielectric layer and the second dielectric layer are able to be separately adjusted. That is, confinement efficiency of the main mode of acoustic waves is able to be further improved, and the film thickness symmetry of the acoustic reflection layer is able to be destroyed, such that unwanted waves are further reduced.

Furthermore, the metal layer may be made of Pt or W.

Accordingly, by setting the acoustic impedance of the metal layer to be higher than the acoustic impedance of the first dielectric layer, confinement of acoustic waves in a portion close to the piezoelectric layer becomes possible.

Furthermore, the first dielectric layer may be made of silicon oxide.

Accordingly, the acoustic impedance of the first dielectric layer is able to be set to be lower than the acoustic impedances of the metal layer and the second dielectric layer, and the frequency-temperature characteristics of the acoustic wave device is able to be improved.

Furthermore, the second dielectric layer may be made of $Ta_2O_5$.

Accordingly, by setting the acoustic impedance of the second dielectric layer to be higher than the acoustic impedance of the first dielectric layer, acoustic waves are able to be efficiently confined.

Furthermore, a high frequency front end circuit according to a preferred embodiment of the present invention includes an acoustic wave device according to a preferred embodiment of the present invention, and an amplifying circuit that is connected to the acoustic wave device.

Accordingly, a high frequency front end circuit in which high frequency propagation loss is reduced or prevented is able to be provided.

Furthermore, a communication apparatus according to a preferred embodiment of the present invention includes a high frequency front end circuit according to a preferred embodiment of the present invention, and a signal processing circuit that processes a high frequency signal.

Accordingly, a communication apparatus in which high frequency propagation loss is reduced is able to be provided.

According to preferred embodiments of the present invention, acoustic wave devices, high frequency front end circuits, and communication apparatuses in each of which an unwanted capacitive component by an acoustic reflector is reduced or prevented, and acoustic wave propagation loss is reduced, are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to drawings. The preferred embodiments described herein illustrate either general or specific examples. Numerical values, shapes, materials, components, and arrangements and structures of connection of the components described in the preferred embodiments are merely examples and are not intended to limit the present invention. Components in the preferred embodiments, except those described in the independent claims, will be explained as optional components. The sizes or the ratios between the sizes of the components illustrated in the drawings are not strictly correct.

First Preferred Embodiment 1-1. Configuration of Acoustic Wave Device

Figure 1A:
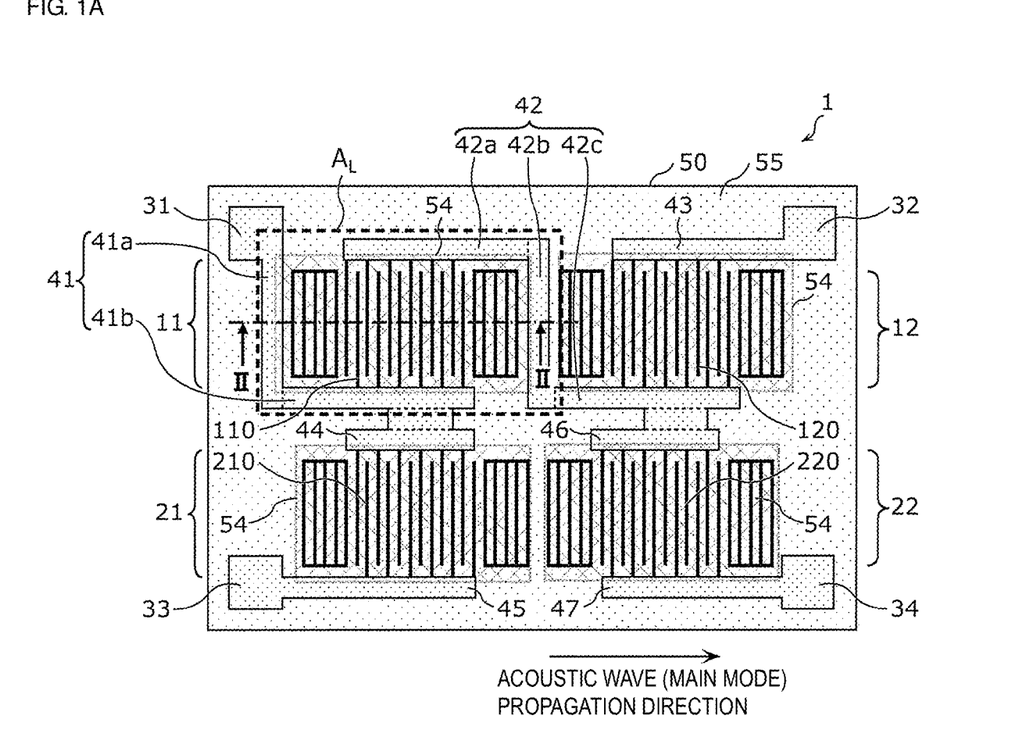
FIG. 1A is a plan view of an acoustic wave device according to a first preferred embodiment of the present invention.
Figure 1B:
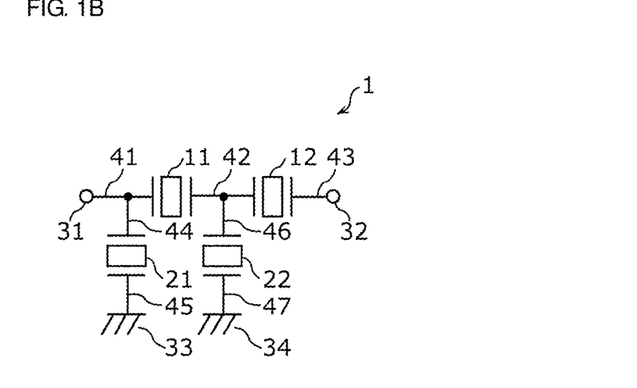
FIG. 1B illustrates an example of a circuit configuration of the acoustic wave device according to the first preferred embodiment of the present invention.
Figure 2:
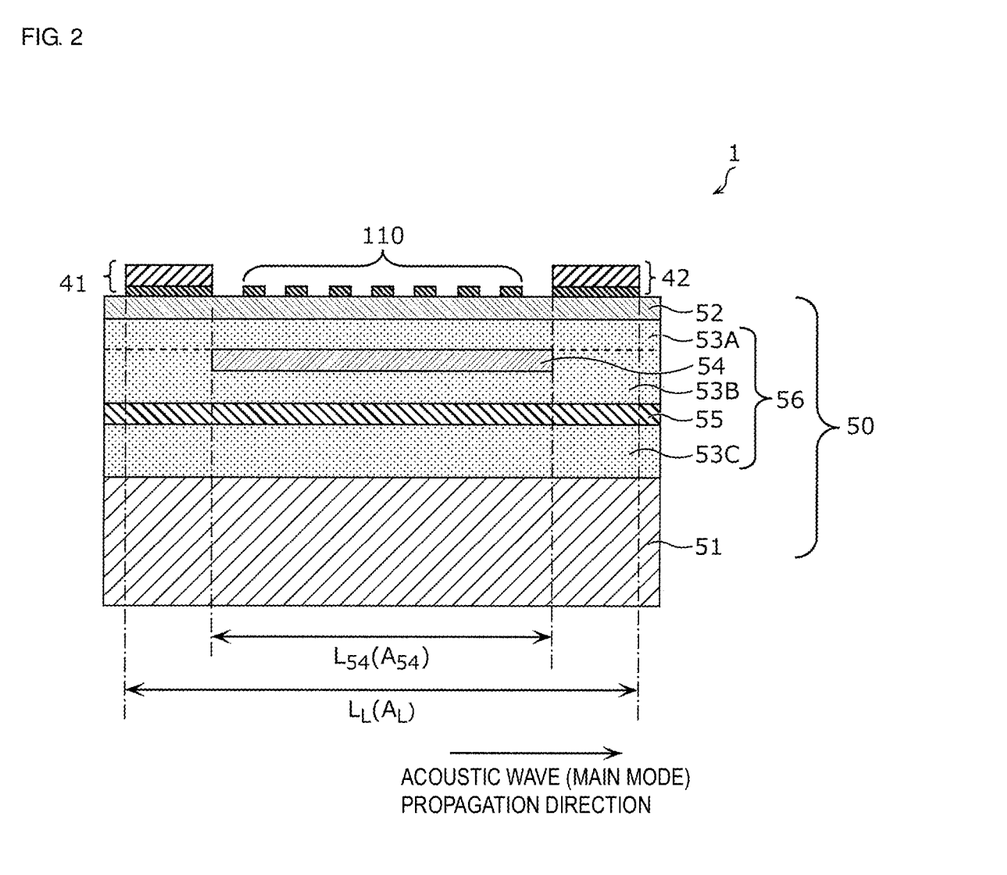
FIG. 2 is a cross-sectional view of the acoustic wave device according to the first preferred embodiment of the present invention.

FIG. 1A is a plan view of an acoustic wave device 1 according to a first preferred embodiment of the present invention. Furthermore, FIG. 1B illustrates an example of a circuit configuration of the acoustic wave device 1 according to the first preferred embodiment. Furthermore, FIG. 2 is a cross-sectional view of the acoustic wave device 1 according to the first preferred embodiment. More specifically, FIG. 2 is a cross-sectional view of the acoustic wave device 1 in FIG. 1A taken along line II-II.

As illustrated in FIG. 1B, the acoustic wave device 1 is a ladder acoustic wave filter that includes series-arm resonators 11 and 12 connected between an input/output terminal 31 and an input/output terminal 32 and parallel-arm resonators 21 and 22 connected between a connecting path from the input/output terminal 31 to the input/output terminal 32 and the ground. The series-arm resonators 11 and 12 and the parallel-arm resonators 21 and 22 are preferably acoustic wave resonators. The acoustic wave device 1 is preferably, for example, a band pass filter that filters, in a specific pass band, a high frequency signal input from the input/output terminal 31 and outputs the filtered high frequency signal to the input/output terminal 32.

In FIG. 1A, an electrode arrangement configuration defining the circuit configuration of the acoustic wave device 1 illustrated in FIG. 1B is illustrated. Specifically, FIG. 1A illustrates an electrode layout of IDT (InterDigital Transducer) electrodes 110, 120, 210, and 220, wiring electrodes 41a, 41b, 42a, 42b, 42c, 43, 44, 45, 46, and 47, the input/output terminals 31 and 32, and ground terminals 33 and 34 that are provided on a substrate 50.

The series-arm resonator 11 illustrated in FIG. 1B includes the IDT electrode 110 including a pair of comb-shaped electrodes, a reflection electrode provided adjacent to the IDT electrode 110 in an acoustic wave propagation direction, and the substrate 50. The series-arm resonator 12 includes the IDT electrode 120 including a pair of comb-shaped electrodes, a reflection electrode provided adjacent to the IDT electrode 120 in an acoustic wave propagation direction, and the substrate 50. The parallel-arm resonator 21 includes the IDT electrode 210 including a pair of comb-shaped electrodes, a reflection electrode provided adjacent to the IDT electrode 210 in an acoustic wave propagation direction, and the substrate 50. The parallel-arm resonator 22 includes the IDT electrode 220 including a pair of comb-shaped electrodes, a reflection electrode provided adjacent to the IDT electrode 220 in an acoustic wave propagation direction, and the substrate 50.

A wiring electrode 41 including the wiring electrodes 41a and 41b connects the IDT electrode 110 with the input/output terminal 31 and also defines and functions as a busbar electrode connecting a plurality of electrode fingers of the IDT electrode 110. The wiring electrode 42a is a busbar electrode connecting a plurality of electrode fingers of the IDT electrode 110. The wiring electrode 42b is wiring that connects the IDT electrode 110 with the IDT electrode 120. The wiring electrode 42c is a busbar electrode connecting a plurality of electrode fingers of the IDT electrode 120. The wiring electrode 42 that includes the wiring electrodes 42a, 42b, and 42c connects the IDT electrode 110 with the IDT electrode 120. A wiring electrode 43 connects the IDT electrode 120 with the input/output terminal 32 and also defines and functions as a busbar electrode connecting a plurality of electrode fingers of the IDT electrode 120. The wiring electrode is a busbar electrode connecting a plurality of electrode fingers of the IDT electrode 210. The wiring electrode 45 connects the IDT electrode 210 with the ground terminal 33 and also defines and functions as a busbar electrode connecting a plurality of electrode fingers of the IDT electrode 210. The wiring electrode is a busbar electrode connecting a plurality of electrode fingers of the IDT electrode 220. The wiring electrode 47 connects the IDT electrode 220 with the ground terminal 34 and also defines and functions as a busbar electrode connecting a plurality of electrode fingers of the IDT electrode 220.

Next, a cross-sectional structure of acoustic wave resonators of the acoustic wave device 1 will be described. FIG. 2 illustrates, in particular, the cross-sectional structure of the series-arm resonator 11. As illustrated in FIG. 2, the acoustic wave device 1 includes the substrate 50, the IDT electrode 110 on the substrate 50, and the wiring electrodes 41 and 42 on the substrate 50. The wiring electrodes 41 and 42 are provided on both sides of the IDT electrode 110 in an acoustic wave propagation direction. Illustration of a reflection electrode is omitted.

The IDT electrode 110 is preferably, for example, made of metal selected from Al, Cu, Pt, Au, Ti, Ni, Cr, Ag, W, Mo, NiCr, Ta, or the like or an alloy or multilayer body of two or more of the metals mentioned above.

The substrate 50 includes a supporting substrate 51, an acoustic reflection layer 56, and a piezoelectric layer 52 that are laminated in this order.

The supporting substrate 51 supports the piezoelectric layer 52 and the acoustic reflection layer 56 and is preferably made of, for example, a semiconductor such as Si, sapphire, LiTaO$_3$, LiNbO$_3$, glass, or the like. One of the above-described materials may be used or two or more of the above-described materials may be used.

A material from which the piezoelectric layer 52 is made is appropriately selected from, for example, LiTaO$_3$, LiNbO$_3$, ZnO, AlN, crystal, and the like, taking into consideration a frequency band, a pass band width, and an electromechanical coupling coefficient required for the acoustic wave device 1.

It is preferable that the film thickness of the piezoelectric layer 52 is less than or equal to an IDT wavelength, which is defined by a pitch of a plurality of electrode fingers of one of a pair of comb-shaped electrodes of an IDT electrode.

Accordingly, the acoustic wave device 1 is able to efficiently excite specific plate waves as a main mode in an acoustic wave propagation direction. Various waves excited in a piezoelectric layer with a film thickness of about 1λ or less, where the wavelength of plate waves excited is represented by 1λ, are generically called plate waves.

Plate waves used for high frequency signal propagation for an acoustic wave device are characterized by being excited in the case where the thickness of a piezoelectric layer in which acoustic waves propagate is reduced to the wavelength (λ) or approximately the wavelength (λ) of acoustic waves or below. With the use of such plate waves, resonant characteristics of an acoustic wave resonator can be improved. Conventionally, as plate wave resonators, which are acoustic wave resonators using such plate waves, acoustic multilayer film resonators including an acoustic multilayer film immediately below a piezoelectric layer and membrane resonators in which a piezoelectric layer floats in midair have been suggested. However, for acoustic wave filters including a plate wave resonator of an acoustic multilayer type, a configuration in which loss in an acoustic wave filter is reduced while plate waves are confined efficiently has not been suggested. To reduce loss in an acoustic wave filter, plate waves need to be efficiently confined. In addition, to adjust a pass band, a circuit defining the acoustic wave filter needs to have an optimal capacitive component. Under such situations, preferred embodiments of the present invention provide a characteristic configuration described below to efficiently confine a main mode of plate waves, add a required capacitance by using an acoustic reflection layer, and reduce or prevent an unnecessary capacitance.

The acoustic reflection layer 56 includes a low Z dielectric layer 53C, a high Z dielectric layer 55, a low Z dielectric layer 53B, a metal layer 54, and a low Z dielectric layer 53A that are laminated in order from the supporting substrate 51 side toward the piezoelectric layer 52.

The low Z dielectric layer 53B includes a dielectric. The low Z dielectric layer 53B is a first dielectric layer that is between the metal layer 54 and the high Z dielectric layer 55 and has an acoustic impedance lower than those of the metal layer 54 and the high Z dielectric layer 55. The low Z dielectric layer 53B is preferably made of, for example, silicon oxide and preferably has a film thickness of, for example, about $0.05\lambda$ to about $0.3\lambda$. When the low Z dielectric layer 53B is made of silicon oxide, the acoustic impedance of the low Z dielectric layer 53B can be lower than the acoustic impedances of the metal layer and the high Z dielectric layer 55, and the frequency-temperature characteristics of the acoustic wave device 1 can thus be improved.

The high Z dielectric layer 55 includes a dielectric. The high Z dielectric layer 55 is a second dielectric layer that is closer to the supporting substrate 51 than the low Z dielectric layer 53B is to the supporting substrate 51 and has an acoustic impedance higher than that of the low Z dielectric layer 53B. The high Z dielectric layer 55 is preferably made of, for example, $Ta_2O_5$ and preferably has a film thickness of, for example, about $0.05\lambda$ to about $0.3\lambda$. When the high Z dielectric layer 55 is made of $Ta_2O_5$, the acoustic impedance of the high Z dielectric layer 55 can be higher than the acoustic impedance of the low Z dielectric layer 53B.

The metal layer 54 is closer to the piezoelectric layer 52 than the low Z dielectric layer 53B is to the piezoelectric layer 52 and has an acoustic impedance higher than that of the low Z dielectric layer 53B. The metal layer 54 is preferably made of, for example, Pt or W and preferably has a film thickness of, for example, about $0.05\lambda$ to about $0.3\lambda$. When the metal layer 54 is made of Pt or W, the acoustic impedance of the metal layer 54 can be higher than the acoustic impedance of the low Z dielectric layer 53B.

The low Z dielectric layer 53A includes a dielectric. The low Z dielectric layer 53A is a third dielectric layer that is between the metal layer 54 and the piezoelectric layer 52 and has an acoustic impedance lower than that of the metal layer 54. The low Z dielectric layer 53A is preferably made of, for example, silicon oxide and preferably has a film thickness of, for example, about $0.05\lambda$ to about $0.3\lambda$. When the low Z dielectric layer 53A is made of silicon oxide, the acoustic impedance of the low Z dielectric layer 53A can be lower than the acoustic impedance of the metal layer 54, and the frequency-temperature characteristics of the acoustic wave device 1 can be improved. Furthermore, with the low Z dielectric layer 53A between the metal layer 54 and the piezoelectric layer 52, a main mode of acoustic waves can be reflected upwards on the interface between the low Z dielectric layer 53A and the metal layer 54.

The low Z dielectric layer 53C includes a dielectric. The low Z dielectric layer 53C is a supporting layer between the supporting substrate 51 and the high Z dielectric layer 55 and bonds the supporting substrate 51 with the high Z dielectric layer 55. Furthermore, the low Z dielectric layer 53C is a dielectric layer with an acoustic impedance lower than that of the high Z dielectric layer 55. The low Z dielectric layer 53C is preferably made of, for example, silicon oxide and preferably has a film thickness of, for example, about $0.05\lambda$ to about $0.3\lambda$. When the low Z dielectric layer 53C is made of silicon oxide, the acoustic impedance of the low Z dielectric layer 53C can be lower than the acoustic impedance of the high Z dielectric layer 55, and the frequency-temperature characteristics of the acoustic wave device 1 can be improved.

In the above-described configuration of the acoustic reflection layer 56, of the metal layer 54 and the high Z dielectric layer 55 that have acoustic impedances higher than those of the low Z dielectric layers 53A and 53B, the metal layer 54 is closer to the piezoelectric layer 52 than the high Z dielectric layer 55 is to the piezoelectric layer 52.

Furthermore, when the acoustic reflection layer 56 is viewed in plan, the metal layer 54 is provided in a region that encompasses the IDT electrode 110. Furthermore, in a region $A_L$ (see FIG. 1A) that encompasses the IDT electrode 110 and the wiring electrodes 41a, 41b, 42a, and 42b connected to the IDT electrode 110 but does not encompass any IDT electrodes other than the IDT electrode 110, an area ($A_{54}$) in which the metal layer 54 is provided is smaller than an area in which the high Z dielectric layer 55 is provided.

With this arrangement, of the metal layer 54 and the high Z dielectric layer 55 that have acoustic impedances higher than that of the low Z dielectric layer 53B, the metal layer 54 is closer to the piezoelectric layer 52 than the high Z dielectric layer 55 is to the piezoelectric layer 52, and the metal layer 54 encompasses the IDT electrode 110 with the piezoelectric layer 52 interposed therebetween. The metal layer 54 has an electrical conductivity higher than that of the high Z dielectric layer 55 and has high pattern processing accuracy. Therefore, a capacitive component can be effectively added to the series-arm resonator 11 including the IDT electrode 110 and the piezoelectric layer 52, and the main mode of plate waves with an increased acoustic velocity can be confined above the metal layer 54. Furthermore, when viewed in plan, the metal layer 54 does not encompass the wiring electrodes 41a, 41b, 42a, and 42b. Therefore, an unwanted capacitive component generated by the wiring electrodes 41 and 42 and the metal layer 54 can be reduced or prevented. In contrast, regarding downward leakage of the main mode of plate waves in a region where the metal layer 54 is not provided, upward reflection occurs on a surface of the high Z dielectric layer 55, which has an acoustic impedance higher than that of the low Z dielectric layer 53B, and propagation loss in the main mode of the plate waves can thus be reduced or prevented. The distance between the high Z dielectric layer 55 and each of the wiring electrodes 41 and 42 is relatively large. Therefore, the high Z dielectric layer 55 and the wiring electrodes 41 and 42 generate small capacitive components, and there is thus no need to perform patterning processing on the high Z dielectric layer 55. Accordingly, with the configuration of the acoustic reflection layer 56 in the present preferred embodiment, the main mode of acoustic waves (plate waves) can be confined above the metal layer 54, and an unwanted capacitive component can be reduced or prevented, such that acoustic wave propagation loss is reduced or prevented.

Furthermore, more preferably, as illustrated in FIG. 2, when viewed in plan, the metal layer 54 is provided in a region that encompasses the IDT electrode 110 but does not encompass either the wiring electrode 41 or the wiring electrode 42. In contrast, the high Z dielectric layer 55 is provided in the entire or substantially the entire region $A_L$ when viewed in plan, as illustrated in FIG. 2. This arrangement will be explained with reference to the cross-sectional view of FIG. 2. When viewed in plan, the metal layer 54 is provided in a region that encompasses the IDT electrode 110 but does not encompass either the wiring electrode 41 or the wiring electrode 42, and a length $L_{54}$ of the metal layer 54 is shorter than a length $L_L$ of the area $A_L$.

Accordingly, when viewed in plan, the metal layer 54 does not overlap with either the wiring electrode 41 or the wiring electrode 42. Therefore, an unwanted capacitive component generated by the wiring electrodes 41 and 42 and the metal layer 54 can be reduced or prevented. Thus, with the configuration of the acoustic reflection layer 56 in the present preferred embodiment, the main mode of acoustic waves (plate waves) can be confined above the metal layer 54, and an unwanted capacitive component can be reduced or prevented with high accuracy, such that acoustic wave propagation loss is reduced.

It is preferable that the film thickness of the low Z dielectric layer 53A is different from the film thickness of the low Z dielectric layer 53B. Thus, the film thickness composition ratio of the low Z dielectric layer 53A and the metal layer 54 optimal to reflect the main mode of acoustic waves (plate waves) on the interface between the low Z dielectric layer 53A and the metal layer 54 and the film thickness composition ratio of the low Z dielectric layer 53B and the high Z dielectric layer 55 optimal to reflect the main mode of acoustic waves (plate waves) on the interface between the low Z dielectric layer 53B and the high Z dielectric layer 55 can be separately adjusted. That is, confinement efficiency of the main mode of acoustic waves (plate waves) can further be improved, and the film thickness symmetry of the acoustic reflection layer can be destroyed, such that unwanted waves are further reduced.

Furthermore, a different layer may be interposed between any one of the supporting substrate 51 and the acoustic reflection layer 56, the acoustic reflection layer 56 and the piezoelectric layer 52, the piezoelectric layer 52 and the IDT electrode 110, and the piezoelectric layer 52 and the above-mentioned wiring electrode.

1-2. Manufacturing Process of Acoustic Wave Device

Next, a non-limiting example of a manufacturing method for the acoustic wave device 1 according to the present preferred embodiment will be described.

Figure 3:
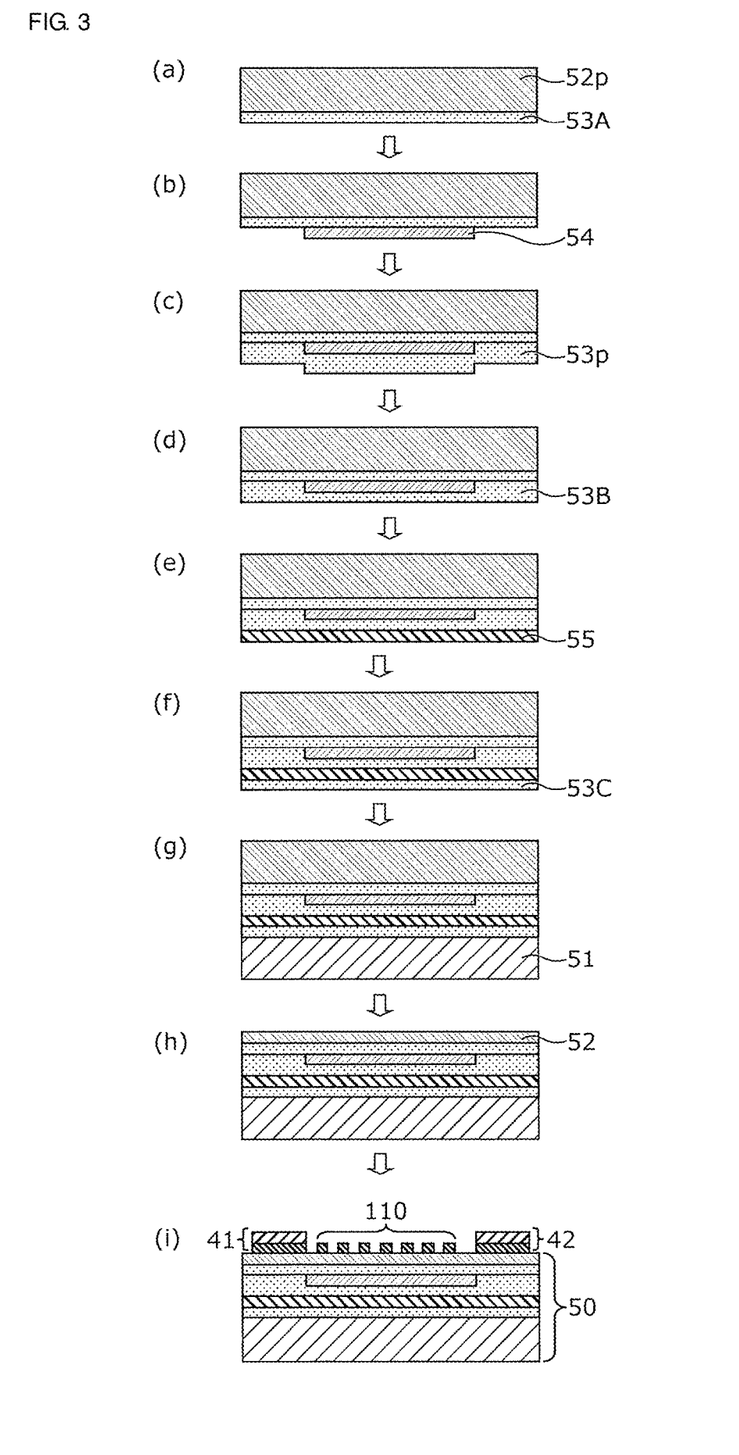
FIG. 3 is a manufacturing process diagram of the acoustic wave device according to the first preferred embodiment of the present invention.

FIG. 3 is a manufacturing process diagram of the acoustic wave device 1 according to the first preferred embodiment.

First, as illustrated in part (a) of FIG. 3, the low Z dielectric layer 53A is formed on a piezoelectric substrate 52p (below the piezoelectric substrate 52p). The low Z dielectric layer 53A is formed by, for example, forming a silicon oxide film by a sputtering method.

Next, as illustrated in part (b) of FIG. 3, the metal layer 54 is pattern-formed on the low Z dielectric layer 53A (below the low Z dielectric layer 53A) by, for example, a deposition lift-off method using photolithography. When the piezoelectric substrate 52p is viewed in plan, the metal layer 54 is patterned to overlap with the IDT electrode 110, which will be formed in a later step.

Next, as illustrated in part (c) of FIG. 3, a low Z dielectric film 53p is formed on the metal layer 54 (below the metal layer 54). The low Z dielectric film 53p is, for example, formed by forming a silicon oxide film by a sputtering method.

Next, as illustrated in part (d) of FIG. 3, the low Z dielectric film 53p is smoothed to form the low Z dielectric layer 53B. Smoothing of the low Z dielectric film 53p is performed by, for example, CMP (Chemical Mechanical Polishing).

Next, as illustrated in part (e) of FIG. 3, the high Z dielectric layer 55 is formed on the low Z dielectric layer 53B (below the low Z dielectric layer 53B). The high Z dielectric layer 55 is formed by, for example, forming a tantalum oxide film ($Ta_2O_5$) by a sputtering method. When the piezoelectric substrate 52p is viewed in plan, the high Z dielectric layer 55 is not patterned to overlap only with the IDT electrode 110, which will be formed in a later step, but is formed over the entire or substantially the entire low Z dielectric layer 53B.

Next, as illustrated in part (f) of FIG. 3, the low Z dielectric layer 53C is formed on the high Z dielectric layer 55 (below the high Z dielectric layer 55). The low Z dielectric layer 53C is formed by, for example, forming a silicon oxide film by a sputtering method.

Next, as illustrated in part (g) of FIG. 3, the supporting substrate 51 is bonded to the multilayer body including the piezoelectric substrate 52p, the low Z dielectric layer 53A, the metal layer 54, the low Z dielectric layer 53B, the high Z dielectric layer 55, and the low Z dielectric layer 53C. The supporting substrate 51 is preferably made of, for example, Si.

Next, as illustrated in part (h) of FIG. 3, the thickness of the piezoelectric substrate 52p is reduced by, for example, polishing or smart cutting, so that the piezoelectric layer 52 is formed.

Finally, as illustrated in part (i) of FIG. 3, the IDT electrode 110 and the wiring electrodes 41 and 42 are pattern-formed by, for example, a deposition lift-off method using photolithography. To reduce resistance of the wiring electrodes 41 and 42, two layers of metal films may be formed.

The above-described manufacturing method for the acoustic wave device 1 is merely an example. The acoustic wave device 1 may include a single metal layer 54 that is located closest to the piezoelectric layer 52 among high acoustic impedance layers and one or more high Z dielectric layers 55, which are high acoustic impedance layers, and there is no restriction on the number of high acoustic impedance layers that may be laminated. The number of low acoustic impedance layers laminated may be varied according to the number of high acoustic impedance layers laminated.

Figure 4:
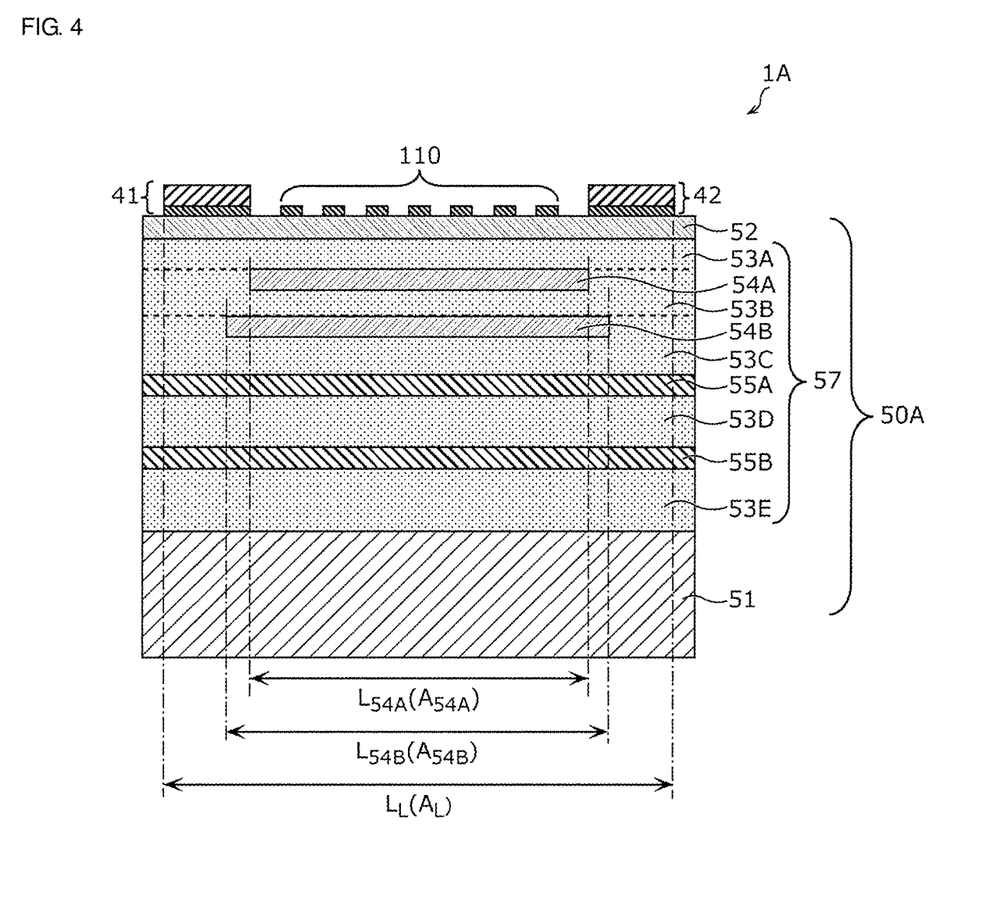
FIG. 4 is a cross-sectional view of an acoustic wave device according to a first modification of the first preferred embodiment of the present invention.

1-3. Configuration of Acoustic Wave Device according to Modification of First Preferred Embodiment FIG. 4 is a cross-sectional view of an acoustic wave device 1A according to a first modification of the first preferred embodiment. The acoustic wave device 1A according to the present modification is different from the acoustic wave device 1 according to the first preferred embodiment in the laminate structure of an acoustic reflection layer 57. The plan view and circuit configuration of the acoustic wave device 1A are similar to the plan view illustrated in FIG. 1A and the circuit configuration illustrated in FIG. 1B. Hereinafter, description of the same or similar features of the acoustic wave device 1A according to the present modification as those of the acoustic wave device 1 according to the first preferred embodiment will be omitted, and description of different features will be focused on.

A cross-sectional structure of acoustic wave resonators defining the acoustic wave device 1A will be described. FIG. 4 illustrates, in particular, a cross-sectional structure of a series-arm resonator 11. As illustrated in FIG. 4, the acoustic wave device 1A includes a substrate 50A, an IDT electrode 110 on the substrate 50A, and wiring electrodes 41 and 42. The wiring electrodes 41 and 42 are provided on both sides of the IDT electrode 110 in an acoustic wave propagation direction. Illustration of a reflection electrode is omitted.

The substrate 50A includes the supporting substrate 51, the acoustic reflection layer 57, and the piezoelectric layer 52 that are laminated in this order.

The acoustic reflection layer 57 includes a low Z dielectric layer 53E, a high Z dielectric layer 55B, a low Z dielectric layer 53D, a high Z dielectric layer 55A, a low Z dielectric layer 53C, a metal layer 54B, a low Z dielectric layer 53B, a metal layer 54A, and a low Z dielectric layer 53A that are laminated in order from the supporting substrate 51 side toward the piezoelectric layer 52.

The metal layers 54A and 54B are laminated in a perpendicular or substantially perpendicular direction of the piezoelectric layer 52. The metal layers 54A and 54B are closer to the piezoelectric layer 52 than the low Z dielectric layer 53C is to the piezoelectric layer 52 and have an acoustic impedance higher than that of the low Z dielectric layer 53C. The metal layers 54A and 54B are preferably made of, for example, Pt or W.

The low Z dielectric layer 53B is a fourth dielectric layer between the metal layers 54A and 54B and has an acoustic impedance lower than those of the metal layers 54A and 54B. The low Z dielectric layer 53B is preferably made of, for example, silicon oxide.

The high Z dielectric layers 55A and 55B are second dielectric layers that are laminated in the perpendicular or substantially perpendicular direction of the piezoelectric layer 52. The high Z dielectric layers 55A and 55B are closer to the supporting substrate 51 than the low Z dielectric layer 53C is to the supporting substrate 51 and have acoustic impedances higher than that of the low Z dielectric layer 53C. The high Z dielectric layers 55A and 55B are preferably made of, for example, $Ta_2O_5$.

The low Z dielectric layer 53D is a fifth dielectric layer between the high Z dielectric layer 55A and the high Z dielectric layer 55B and has an acoustic impedance lower than those of the high Z dielectric layers 55A and 55B. The low Z dielectric layer 53D is preferably made of, for example, silicon oxide.

In the configuration of the acoustic reflection layer 57 described above, of the metal layers 54A and 54B and the high Z dielectric layers 55A and 55B that have acoustic impedances higher than those of the low Z dielectric layers 53A, 53B, 53C, 53D, and 53E, the metal layers 54A and 54B are closer to the piezoelectric layer 52 than the high Z dielectric layers 55A and 55B are to the piezoelectric layer 52.

Furthermore, when the acoustic reflection layer 57 is viewed in plan, the metal layers 54A and 54B overlap with the IDT electrode 110. Furthermore, in an integrated region $A_L$ (see FIG. 1A) that overlaps with the IDT electrode 110 and the wiring electrodes 41a, 41b, 42a, and 42b connected to the IDT electrode 110, an area ($A_{54A}$) in which the metal layer 54A is provided and an area ($A_{54B}$) in which the metal layer 54B is provided are smaller than the areas in which the high Z dielectric layers 55A and 55B are provided.

Furthermore, more preferably, as illustrated in FIG. 4, when viewed in plan, the metal layers 54A and 54B are provided in a region that encompasses the IDT electrode 110 but does not encompass either the wiring electrode 41 or the wiring electrode 42. In contrast, as illustrated in FIG. 4, when viewed in plan, the high Z dielectric layers 55A and 55B are provided over the entire or substantially the entire region $A_L$. This arrangement will be explained with reference to the cross-sectional view of FIG. 4. When viewed in plan as mentioned above, the metal layers 54A and 54B are provided in the region that encompasses the IDT electrode 110 but does not encompass either the wiring electrode 41 or the wiring electrode 42, and each of a length $L_{54A}$ of the metal layer 54A and a length $L_{54B}$ of the metal layer 54B is shorter than a length $L_L$ of the integrated region $A_L$ including the wiring electrodes 41 and 42.

Accordingly, of the metal layers 54A and 54B and the high Z dielectric layers 55A and 55B that have acoustic impedances higher than that of the low Z dielectric layer 53C, the metal layers 54A and 54B are closer to the piezoelectric layer 52 than the high Z dielectric layers 55A and 55B are to the piezoelectric layer 52, and the metal layers 54A and 54B overlap with the IDT electrode 110 with the piezoelectric layer 52 interposed therebetween. Compared to the high Z dielectric layers 55A and 55B, the metal layers 54A and 54B have high acoustic impedances, high electrical conductivity, and high pattern processing accuracy. Therefore, a capacitive component can be effectively added to the series-arm resonator 11 including the IDT electrode 110 and the piezoelectric layer 52, and the main mode of plate waves can be efficiently confined above the metal layer 54B. Furthermore, when viewed in plan, the metal layers 54A and 54B do not encompass either the wiring electrode 41 or the wiring electrode 42. Therefore, an unwanted capacitive component generated by the wiring electrodes 41 and 42 and the metal layers 54A and 54B can be reduced or prevented. In contrast, regarding downward leakage of plate waves in a region in which neither the metal layer 54A nor the metal layer 54B is provided, upward reflection occurs on surfaces of the high Z dielectric layers 55A and 55B that have acoustic impedances higher than that of the low Z dielectric layer 53C. Therefore, propagation loss of the plate waves can be reduced or prevented. The distance from the high Z dielectric layers 55A and 55B to the wiring electrodes 41 and 42 is relatively large, and the high Z dielectric layers 55A and 55B and the wiring electrodes 41 and 42 thus generate small capacitive components. Therefore, there is no need to pattern-process the high Z dielectric layers 55A and 55B. Accordingly, with the configuration of the acoustic reflection layer 57 according to the present modification, the main mode of acoustic waves can be confined above the metal layer 54B, and an unwanted capacitive component can be reduced or prevented, such that acoustic wave propagation loss is reduced or prevented.

It is preferable that the film thickness of the low Z dielectric layer 53B is different from the film thickness of the low Z dielectric layer 53D. Accordingly, the film thickness composition ratio of the low Z dielectric layer 53B and the metal layer 54B optimal to reflect the main mode of acoustic waves on the interface between the low Z dielectric layer 53B and the metal layer 54B and the film thickness composition ratio of the low Z dielectric layer 53D and the high Z dielectric layer 55B optimal to reflect the main mode of acoustic waves on the interface between the low Z dielectric layer 53D and the high Z dielectric layer 55B can be separately adjusted. That is, confinement efficiency of the main mode of acoustic waves can further be improved, and the film thickness symmetry of an acoustic reflection layer can be destroyed, such that unwanted waves are further reduced or prevented.

In the present modification, a configuration in which the acoustic reflection layer 57 includes two metal layers, the metal layers 54A and 54B, and includes two second dielectric layers, the high Z dielectric layers 55A and 55B, is illustrated as an example. However, a metal layer or a second dielectric layer may be a single layer.

Furthermore, the acoustic reflection layer 57 may include at least one of three or more metal layers and three or more high Z dielectric layers as second dielectric layers.

Figure 5:
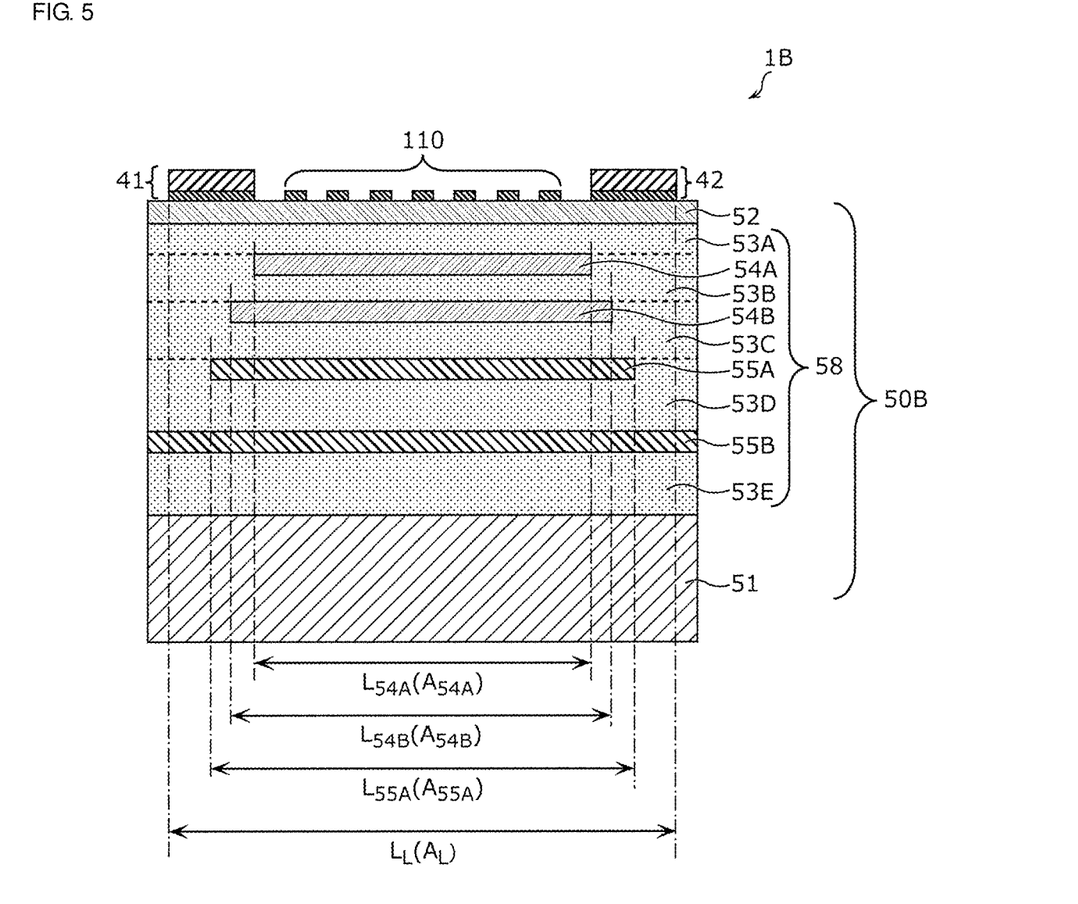
FIG. 5 is a cross-sectional view of an acoustic wave device according to a second modification of the first preferred embodiment of the present invention.

FIG. 5 is a cross-sectional view of an acoustic wave device 1B according to a second modification of the first preferred embodiment of the present invention. The acoustic wave device 1B according to the present modification is different from the acoustic wave device 1A according to the first modification in that the area in which the high Z dielectric layer 55A is provided is smaller than the area in which the high Z dielectric layer 55B is provided. The plan view and circuit configuration of the acoustic wave device 1B are similar to the plan view illustrated in FIG. 1A and the circuit configuration illustrated in FIG. 1B. Hereinafter, description of the same or similar features of the acoustic wave device 1B according to the present modification as those of the acoustic wave device 1A according to the first modification will be omitted, and description of different features will be focused on.

A cross-sectional structure of acoustic wave resonators forming the acoustic wave device 1B will be described. FIG. 5 illustrates, in particular, a cross-sectional structure of a series-arm resonator 11. As illustrated in FIG. 5, the acoustic wave device 1B includes a substrate 50B, an IDT electrode 110 on the substrate 50B, and wiring electrodes 41 and 42. The wiring electrodes 41 and 42 are on both sides of the IDT electrode 110 in an acoustic wave propagation direction. Illustration of a reflection electrode is omitted.

The substrate 50B includes a supporting substrate 51, an acoustic reflection layer 58, and a piezoelectric layer 52 that are laminated in this order.

The acoustic reflection layer 58 includes a low Z dielectric layer 53E, a high Z dielectric layer 55B, a low Z dielectric layer 53D, a high Z dielectric layer 55A, a low Z dielectric layer 53C, a metal layer 54B, a low Z dielectric layer 53B, a metal layer 54A, and a low Z dielectric layer 53A that are laminated in order from the supporting substrate 51 side toward the piezoelectric layer 52.

The high Z dielectric layers 55A and 55B are second dielectric layers that are laminated in a perpendicular or substantially perpendicular direction of the piezoelectric layer 52. The high Z dielectric layers 55A and 55B are closer to the supporting substrate 51 than the low Z dielectric layer 53C is to the supporting substrate 51 and has an acoustic impedance higher than that of the low Z dielectric layer 53C. The high Z dielectric layers 55A and 55B are preferably made of, for example, $Ta_2O_5$.

In the configuration of the acoustic reflection layer 58 described above, of the metal layers 54A and 54B and the high Z dielectric layers 55A and 55B that have acoustic impedances higher than those of the low Z dielectric layers 53A, 53B, 53C, 53D, and 53E, the metal layers 54A and 54B are closer to the piezoelectric layer 52 than the high Z dielectric layers 55A and 55B are to the piezoelectric layer 52.

Furthermore, when the acoustic reflection layer 58 is viewed in plan, the metal layers 54A and 54B overlap with the IDT electrode 110. Furthermore, in an integrated region $A_L$ (see FIG. 1A) that overlaps with the IDT electrode 110 and the wiring electrodes 41a, 41b, 42a, and 42b connected to the IDT electrode 110, an area ($A_{54A}$) in which the metal layer 54A is provided and an area ($A_{54B}$) in which the metal layer 54B is provided are smaller than the areas in which the high Z dielectric layers 55A and 55B are provided.

Furthermore, more preferably, as illustrated in FIG. 5, when viewed in plan, the metal layers 54A and 54B are provided in a region that encompasses the IDT electrode 110 but does not encompass either the wiring electrode 41 or the wiring electrode 42. In contrast, the high Z dielectric layer 55A is provided in a region that encompasses the IDT electrode 110 but does not encompass either the wiring electrode 41 or the wiring electrode 42, and the area in which the high Z dielectric layer 55A is provided is larger than the area in which the metal layer 54B is provided but is smaller than the area in which the high Z dielectric layer 55B is provided. Furthermore, the high Z dielectric layer 55B is, as illustrated in FIG. 5, provided over the entire or substantially the entire region $A_L$, when viewed in plan. This arrangement will be explained with reference to the cross-sectional view of FIG. 5. When viewed in plan, the metal layers 54A and 54B are provided in the region that encompasses the IDT electrode 110 but does not encompass either the wiring electrode 41 or the wiring electrode 42, and each of a length $L_{54A}$ of the metal layer 54A and a length $L_{54B}$ of the metal layer 54B is shorter than a length $L_L$ of the region $A_L$.

Accordingly, of the metal layers 54A and 54B and the high Z dielectric layers 55A and 55B that have acoustic impedances higher than that of the low Z dielectric layer 53C, the metal layers 54A and 54B are closer to the piezoelectric layer 52 than the high Z dielectric layers 55A and 55B are to the piezoelectric layer 52, and the metal layers 54A and 54B overlap with the IDT electrode 110 with the piezoelectric layer 52 interposed therebetween. Compared to the high Z dielectric layers 55A and 55B, the metal layers 54A and 54B have high acoustic impedances, high electrical conductivity, and high processing accuracy of patterning. Therefore, a capacitive component can be added effectively to the series-arm resonator 11 that includes the IDT electrode 110 and the piezoelectric layer 52, and the main mode of plate waves can be efficiently confined above the metal layer 54B. Furthermore, when viewed in plan, the metal layers 54A and 54B are arranged to encompass neither the wiring electrode 41 nor the wiring electrode 42. Therefore, unwanted capacitive components generated by the wiring electrodes 41 and 42 and the metal layers 54A and 54B can be reduced or prevented. As illustrated in FIG. 5, as the distance from the piezoelectric layer 52 increases, the areas in which the metal layers 54A and 54B are provided may be increased. That is, the area in which the metal layer 54B, which is farther away from the piezoelectric layer 52, is provided may be larger than the area in which the metal layer 54A, which is closer to the piezoelectric layer 52, is provided. Thus, there is little influence on a capacitive change, and moreover, acoustic waves may be trapped in a wider region.

In contrast, regarding downward leakage of plate waves in a region in which neither the metal layer 54A nor the metal layer 54B is provided, upward reflection occurs on surfaces of the high Z dielectric layers 55A and 55B that have acoustic impedances higher than that of the low Z dielectric layer 53C. Therefore, propagation loss of the plate waves can be reduced or prevented. The distances from the high Z dielectric layers 55A and 55B to the wiring electrodes 41 and 42 are relatively large. Therefore, the high Z dielectric layers 55A and 55B and the wiring electrodes 41 and 42 generate small capacitive components. Thus, instead of pattern-processing the high Z dielectric layer 55B, which is farther away from the piezoelectric layer 52 than the high Z dielectric layer 55A is from the piezoelectric layer 52, the high Z dielectric layer 55A may be pattern-processed to a size between the metal layer 54B and the high Z dielectric layer 55B. That is, as the distance from the piezoelectric layer 52 increases, a formation area may be increased. By decreasing the area in which the high Z dielectric layer 55A or 55B is provided, stress on a substrate by a high Z dielectric layer may be reduced. In the present modification, the metal layers 54A and 54B and the high Z dielectric layers 55A and 55B are arranged in ascending order of the distance from the piezoelectric layer 52 and ascending order of the formation area.

As described above, with the configuration of the acoustic reflection layer 58 according to the present modification, the main mode of acoustic waves (plate waves) can be confined above the metal layer 54B, and an unwanted capacitive component can be reduced or prevented, such that acoustic wave propagation loss is reduced or prevented.

It is preferable that the film thickness of the low Z dielectric layer 53B and the film thickness of the low Z dielectric layer 53D are different. Accordingly, the film thickness composition ratio of the low Z dielectric layer 53B and the metal layer 54B optimal to reflect the main mode of acoustic waves (plate waves) on the interface between the low Z dielectric layer 53B and the metal layer 54B and the film thickness composition ratio of the low Z dielectric layer 53D and the high Z dielectric layer 55B optimal to reflect the main mode of acoustic waves (plate waves) on the interface between the low Z dielectric layer 53D and the high Z dielectric layer 55B can be separately adjusted. That is, confinement efficiency of the main mode of acoustic waves (plate waves) can further be improved, and the film thickness symmetry of an acoustic reflection layer can be destroyed, such that unwanted waves are further reduced or prevented.

In the present modification, a configuration in which the acoustic reflection layer 58 includes two metal layers, the metal layers 54A and 54B, and includes two second dielectric layers, the high Z dielectric layers 55A and 55B, is illustrated as an example. However, a metal layer or a second dielectric layer may be a single layer.

Furthermore, the acoustic reflection layer 57 may include at least one of three or more metal layers and three or more high Z dielectric layers as second dielectric layers.

Second Preferred Embodiment

Figure 6:
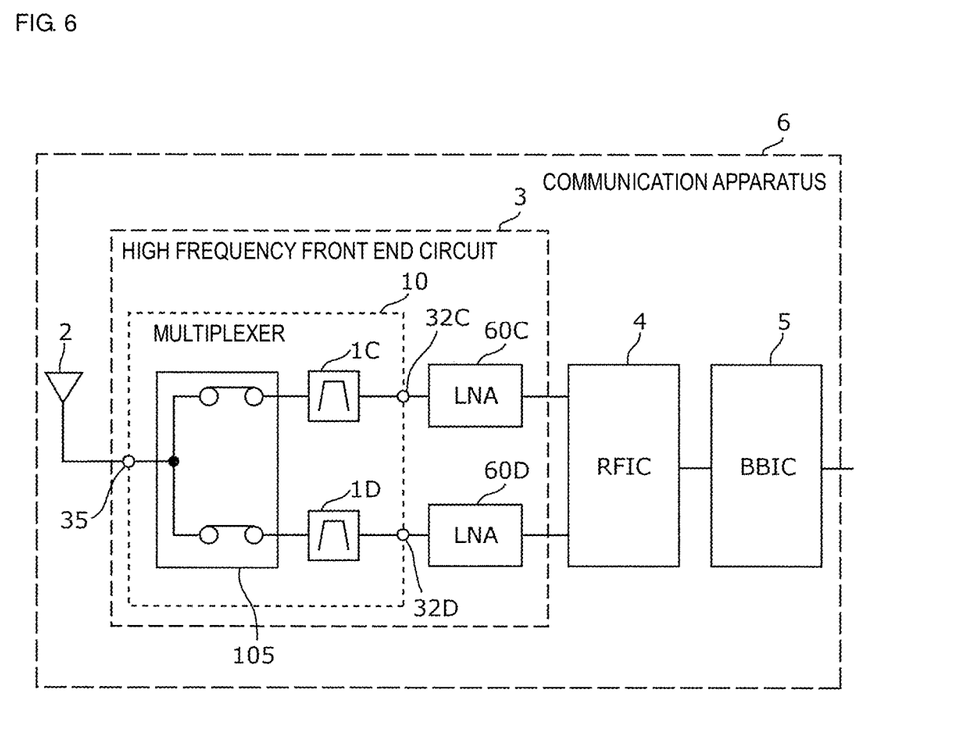
FIG. 6 is a circuit configuration diagram illustrating a high frequency front end circuit and a communication apparatus according to a second preferred embodiment of the present invention.

FIG. 6 is a circuit configuration diagram illustrating a high frequency front end circuit 3 and a communication apparatus according to a second preferred embodiment of the present invention. In the high frequency front end circuit 3 and the communication apparatus 6 according to the present preferred embodiment, any one of the acoustic wave devices 1, 1A, and 1B according to the first preferred embodiment may be used for a first filter 1C and a second filter 1D.

As illustrated in FIG. 6, in the high frequency front end circuit 3 and the communication apparatus 6, to amplify a high frequency signal, LNAs (Low Noise Amplifiers) 60C and 60D (amplifying circuits) are provided between a first terminal 32C and an RFIC 4 and between a second terminal 32D and the RFIC 4, respectively. Furthermore, to switch the state of connection with an antenna element 2, a multiport switch 105 is provided between the first filter 10 and an antenna common terminal 35 and between the second filter 1D and the antenna common terminal 35. The multiport switch 105 is a switch that turns ON or OFF at the same time. When the first filter 10 is connected to the antenna common terminal 35, that is, when the first filter 10 is performing signal processing, the second filter 1D can also be connected to the antenna common terminal 35.

With the high frequency front end circuit 3 and the communication apparatus 6 having the circuit configuration described above, the main mode of acoustic waves of the first filter 10 and the second filter 1D can be confined above a metal layer, and an unwanted capacitive component can be reduced or prevented, such that acoustic wave propagation loss is reduced or prevented. Thus, the high frequency front end circuit 3 and the communication apparatus 6 in which high frequency propagation loss is reduced or prevented can be provided.

Furthermore, although the first filter 10 and the second filter 1D are provided as reception filters in the present preferred embodiment, the present invention is not limited to this configuration. The first filter 10 and the second filter 1D may be provided as transmission filters. In this case, for example, the LNA 60C located between the first filter 1C and the RFIC 4 and the LNA 60D located between the second filter 1D and the RFIC 4 may be replaced by PAs (Power Amplifiers). Thus, a communication apparatus 6 that is able to perform transmission can be provided.

Furthermore, the first filter 1C may be provided as a transmission filter, and the second filter 1D may be provided as a reception filter. In this case, for example, the LNA 60C located between the first filter 1C and the RFIC 4 may be replaced by a PA. Thus, a communication apparatus 6 that is able to perform transmission and reception can be provided.

Other Preferred Embodiments

The acoustic wave devices 1, 1A, and 1B according to the first preferred embodiment and modifications thereof, and the high frequency front end circuit 3 and the communication apparatus 6 according to the second preferred embodiment have been described above as preferred embodiments and modifications. However, the present invention is not intended to be limited to the preferred embodiments and modifications described above. Other preferred embodiments provided by combining any components in the preferred embodiments and the modifications, modifications obtained by making various changes to the preferred embodiments that are conceived by those skilled in the art without departing from the scope of the present invention, various types of equipment in which acoustic wave devices, high frequency front end circuits, and communication apparatuses according to preferred embodiments of the present invention and modifications thereof are built, are also included in the present invention.

Furthermore, the acoustic wave devices 1, 1A, and 1B according to the first preferred embodiment and modifications thereof are not limited to the ladder circuit configuration illustrated in FIG. 1B and may be configured as, for example, a longitudinally-coupled resonance circuit, a laterally-coupled resonance circuit, a transverse resonance circuit, or the like.

Preferred embodiments of the present invention and modifications thereof are widely used for various types of electronic equipment and communication equipment. The electronic equipment may be, for example, a sensor. The communication equipment may be, for example, communication module equipment including a duplexer including an acoustic wave device according to a preferred embodiment of the present invention, a PA, an LNA, and a switch, mobile communication equipment or healthcare communication equipment including the communication module equipment, or the like. The mobile communication equipment may be, for example, a mobile phone, a smartphone, a car navigation system, or the like. The healthcare communication equipment may be a body scale, a body fat scale, or the like. The healthcare communication equipment or the mobile communication equipment includes an antenna, an RF module, a display, an input unit, a power source, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a supporting substrate;
   an acoustic reflection layer directly or indirectly on the supporting substrate;
   a piezoelectric layer directly or indirectly on the acoustic reflection layer;
   one or more IDT electrodes directly or indirectly on the piezoelectric layer; and
   a wiring electrode directly or indirectly on the piezoelectric layer and electrically connected to the one or more IDT electrodes; wherein
   the acoustic reflection layer includes:
      a first dielectric layer;
      a second dielectric layer closer to the supporting substrate than the first dielectric is to the supporting substrate and having an acoustic impedance higher than that of the first dielectric layer; and
      a metal layer closer to the piezoelectric layer than the first dielectric layer is to the piezoelectric layer and having an acoustic impedance higher than that of the first dielectric layer; and
   when the acoustic reflection layer is viewed in plan, in a region that encompasses one of the one or more IDT electrodes and a wiring electrode connected to the one IDT electrode but does not encompass any IDT electrodes other than the one of the one or more IDT electrodes, an area in which the metal layer is provided is smaller than an area in which the second dielectric layer is provided.

2. The acoustic wave device according to claim 1, wherein
   each of the one or more IDT electrodes includes a pair of comb-shaped electrodes; and
   a film thickness of the piezoelectric layer is less than or equal to an IDT wavelength, which is defined by a pitch of a plurality of electrode fingers of one of the pair of comb-shaped electrodes.

3. The acoustic wave device according to claim 1, wherein the acoustic reflection layer further includes a third dielectric layer between the metal layer and the piezoelectric layer and has an acoustic impedance lower than that of the metal layer.

4. The acoustic wave device according to claim 3, wherein a film thickness of the third dielectric layer and a film thickness of the first dielectric layer are different.

5. The acoustic wave device according to claim 1, wherein the acoustic reflection layer includes:
   at least one of a plurality of the metal layers provided in a perpendicular or substantially perpendicular direction of the piezoelectric layer and a plurality of the second dielectric layers laminated in the perpendicular or substantially perpendicular direction;
   a fourth dielectric layer having an acoustic impedance lower than that of the plurality of metal layers and being respectively provided between the plurality of metal layers; and
   a fifth dielectric layer having an acoustic impedance lower than that of the plurality of second dielectric layers and being respectively provided between the plurality of second dielectric layers.

6. The acoustic wave device according to claim 5, wherein a film thickness of the fourth dielectric layer and a film thickness of the fifth dielectric layer are different.

7. The acoustic wave device according to claim 1, wherein the metal layer is made of Pt or W.

8. The acoustic wave device according to claim 1, wherein the first dielectric layer is made of silicon oxide.

9. The acoustic wave device according to claim 1, wherein the second dielectric layer is made of $Ta_2O_5$.

10. The acoustic wave device according to claim 1, wherein, when the acoustic reflection layer is viewed in plan, the metal layer is in a region that encompasses the one of the one or more IDT electrodes but does not encompass the wiring electrode.

11. A high frequency front end circuit comprising:
    the acoustic wave device according to claim 1; and
    an amplifying circuit connected to the acoustic wave device.

12. The high frequency front end circuit according to claim 11, wherein
    each of the one or more IDT electrodes includes a pair of comb-shaped electrodes; and
    a film thickness of the piezoelectric layer is less than or equal to an IDT wavelength, which is defined by a pitch of a plurality of electrode fingers of one of the pair of comb-shaped electrodes.

13. The high frequency front end circuit according to claim 11, wherein the acoustic reflection layer further includes a third dielectric layer between the metal layer and the piezoelectric layer and has an acoustic impedance lower than that of the metal layer.

14. The high frequency front end circuit according to claim 13, wherein a film thickness of the third dielectric layer and a film thickness of the first dielectric layer are different.

15. The high frequency front end circuit according to claim 11, wherein
    the acoustic reflection layer includes:
        at least one of a plurality of the metal layers provided in a perpendicular or substantially perpendicular direction of the piezoelectric layer and a plurality of the second dielectric layers laminated in the perpendicular or substantially perpendicular direction;
        a fourth dielectric layer having an acoustic impedance lower than that of the plurality of metal layers and being respectively provided between the plurality of metal layers; and
        a fifth dielectric layer having an acoustic impedance lower than that of the plurality of second dielectric layers and being respectively provided between the plurality of second dielectric layers.

16. The high frequency front end circuit according to claim 15, wherein a film thickness of the fourth dielectric layer and a film thickness of the fifth dielectric layer are different.

17. The high frequency front end circuit according to claim 11, wherein the metal layer is made of Pt or W.

18. The high frequency front end circuit according to claim 11, wherein the first dielectric layer is made of silicon oxide.

19. The high frequency front end circuit according to claim 11, wherein the second dielectric layer is made of $Ta_2O_5$.

20. A communication apparatus comprising:
    the high frequency front end circuit according to claim 11; and
    a signal processing circuit that processes a high frequency signal.

* * * * *